United States Patent [19]

Hedley et al.

[11] Patent Number: 4,766,496

[45] Date of Patent: Aug. 23, 1988

[54] VIDEO SIGNAL MEMORIES

[75] Inventors: David J. Hedley, Winchester; Morgan W. A. David, Farnham, both of United Kingdom

[73] Assignee: Sony Corporation, Tokyo, Japan

[21] Appl. No.: 776,958

[22] Filed: Sep. 17, 1985

[30] Foreign Application Priority Data

Sep. 25, 1984 [GB] United Kingdom ............... 8424201

[51] Int. Cl.$^4$ .................................... H04N 5/14
[52] U.S. Cl. .................................... 358/160; 358/22
[58] Field of Search ............... 358/160, 22; 382/27, 382/44, 49; 340/750, 798, 799, 747

[56] References Cited

U.S. PATENT DOCUMENTS

| | | | |
|---|---|---|---|
| 3,996,559 | 12/1976 | Morrin et al. | 382/44 |
| 4,090,174 | 5/1978 | Van Voorhis | 382/44 |
| 4,437,121 | 3/1984 | Taylor | 358/160 |
| 4,667,190 | 5/1987 | Fant | 340/798 |

FOREIGN PATENT DOCUMENTS 8400629 2/1984 PCT Int'l Appl. .
1156380 6/1969 United Kingdom .
1316300 5/1973 United Kingdom .
1423397 2/1976 United Kingdom .
2117942 10/1983 United Kingdom .

Primary Examiner—James J. Groody
Assistant Examiner—David E. Harvey
Attorney, Agent, or Firm—Lewis H. Eslinger; Donald S. Dowden

[57] ABSTRACT

A video signal memory which may, for example, form a field memory in a special effects equipment of a high definition video system, provides storage for $n^2m$ video data words and has $n^2$ memory modules each capable of storing m video data words corresponding respectively to sample values at respective sample positions of a raster display, each memory module being arranged to store one only of the video data words in any square of n by n sample positions of the raster in any one write cycle, and means to write up to n video data words corresponding to n adjacent collinear sample positions of the raster in the video memory in any one write cycle.

5 Claims, 3 Drawing Sheets

FIG. 3.

|   | 1 | 2 | 3 | 4 | 5 | 6 | 7 | 8 | 9 | 10 | 11 | SAMPLE POSITIONS → |
|---|---|---|---|---|---|---|---|---|---|----|----|---|
| 1 | 1.1 | 1.2 | 1.3 | | | | | | 1.1 | 1.2 | 1.3 | |
| 2 | 2.1 | | | | | | | | 2.1 | | | |
| 3 | 3.1 | | | | | | | | 3.1 | | | |
| 4 | 4.1 | | | | | | | | 4.1 | | | |
| 5 | | | | | | | | | | | | |
| 6 | | | | | | | | | | | | |
| 7 | | | | | | | | | | | | |
| 8 | | | | | | | | | | | | |
| 9 | 1.1 | 1.2 | 1.3 | | | | | | | | | |
| 10 | 2.1 | | | | | | | | | | | |
| 11 | 3.1 | | | | | | | | | | | |
| 12 | 4.1 | | | | | | | | | | | |

↓ LINES

| 1.1 | 1.2 | 1.3 | 1.4 | 1.5 | 1.6 | 1.7 | 1.8 | 1.1 | 1.2 |
|---|---|---|---|---|---|---|---|---|---|
| 2.1 | 2.2 | 2.3 ⊠ | 2.4 ⊠ | 2.5 ⊠ | 2.6 ⊠ | 2.7 ⊠ | 2.8 ⊠ | 2.1 ⊠ | 2.2 ⊠ |
| 3.1 | 3.2 | 3.3 | | | | | | 3.1 | 3.2 |
| 4.1 | 4.2 | | | | | | | 4.1 | |
| 5.1 | | | LEVEL | 0 | | | | LEVEL | 1 |
| 6.1 | | | | | | | | | |
| 7.1 | | | | | | | | | |
| 8.1 | | | | | | | 8.8 | 8.1 | |
| 1.1 | | | | | | | 1.8 | 1.1 | |
| | | | LEVEL | N | | | | LEVEL | N+1 |

FIG. 5.

| 1.1 | 1.2 | 1.3 | 1.4 | 1.5 | 1.6 | 1.7 | 1.8 | 1.1 | 1.2 |
|-----|-----|-----|-----|-----|-----|-----|-----|-----|-----|
| 2.1 | 2.2 | 2.3 | 2.4 | 2.5 | 2.6 | 2.7 | 2.8 | 2.1 |     |
| 3.1 | 3.2 ⊠ | 3.3 |   |   |   |   |   |   |   |
| 4.1 | 4.2 | 4.3 ⊠ | 4.4 |   | LEVEL 0 |   |   | LEVEL 1 |   |
| 5.1 |     | 5.3 | 5.4 ⊠ | 5.5 |   |   |   |   |   |
| 6.1 |     |     |     | 6.5 ⊠ |   |   |   |   |   |
| 7.1 |     |     |     |     | 7.6 ⊠ |   |   |   |   |
| 8.1 |     |     |     |     |     | 8.7 ⊠ | 8.8 | 8.1 |   |
| 1.1 |     |     |     |     |     | 1.7 | 1.8 ⊠ | 1.1 |   |
| 2.1 |     |     |     |     |     |     | 2.8 | 2.1 ⊠ | 2.2 |
|     |     | LEVEL N |   |   |   |   |   | LEVEL N+1 |   |

VIDEO SIGNAL MEMORIES

BACKGROUND OF THE INVENTION

1. Field of the Invention

This invention relates to video signal memories. More particularly, but not exclusively, this invention relates to memories which are suitable for use in a high definition video system, and more particularly still to memories which are suitable for use in special effects equipment for such a video system.

2. Description of the Prior Art

The standard television signal transmitted in the United Kingdom is a PAL signal of a 625-lines per frame, 50-fields per second system, and the PAL, NTSC and SECAM signals transmitted in other countries use similar or slightly lower line frequencies (for example 525 lines per frame), and similar or slightly higher field frequencies (for example 60 fields per second). While there is no immediate prospect of significant changes in these transmitted signals, there is an increasing requirement for higher defintion video systems. Such systems can be used, for example, in film-making, in closed circuit television systems, in satellite communication systems and in studio use generally. One such proposed high definition video system uses 1125 lines per frame and 60 fields per second. This proposed system also uses a 5:3 aspect ratio instead of the 4:3 aspect ratio now usual for television receivers.

The special effects which can be applied to a video signal are well known. Thus, for example, images on a cathode ray tube can be off-set (moved in any direction), scaled (expanded or compressed in size), rolled (rotated in two or three dimensions) and so on.

One way of achieving such special effects, which will be referred to in more detail below, involves converting an input analog video signal into digital form, modifying the individual input digital signals in a field memory, and reading from the field memory to derive the required output digital signals. In the proposed high definition video system referred to above, the input analog video signal is sampled 2048 times per horizontal line scan, so the sample frequency is 69.12 MHz and the sample interval is approximately 14.7 nanoseconds. The time available for writing each digital signal into the field memory is therefore somewhat less than 14.7 nanoseconds because of the modification step in special effects, and the problem is to provide a memory capable of operating at this very high speed.

SUMMARY OF THE INVENTION

One object of the present invention is to provide a video signal memory in which data can be written at high speed.

Another object of the present invention is to provide a video signal memory in which data can be written at more than one location simultaneously.

According to the present invention there is provided a video signal memory for storing $n^2m$ video data words, comprising: $n^2$ memory modules each capable of storing m said video data words corresponding respectively to sample values at respective sample positions of a raster display, each said memory module being arranged to store one only of said video data words in any square of n by n said sample positions of said raster in any one write cycle; and means to write up to n said video data words corresponding to n adjacent collinear sample positions of said raster in said video memory in any one write cycle.

Thus in embodiments of the invention the time available for writing in the memory modules is increased by a factor of n, because n data words are written simultaneously, rather than being demultiplexed and written sequentially.

The above, and other objects, features and advantages of this invention will be apparent from the following detailed description of illustrative embodiments which is to be read in connection with the accompanying drawings.

BRIEF DESCRIPTION OF THE DRAWINGS

FIG. 3 shows diagrammatically the relationship between the video signal memory of FIG. 2 and the raster of a cathode ray tube screen; and FIGS. 4 and 5 indicate diagrammatically examples of the use of the video signal memory of FIG. 2.

DESCRIPTION OF THE PREFERRED EMBODIMENTS

Figure 1:
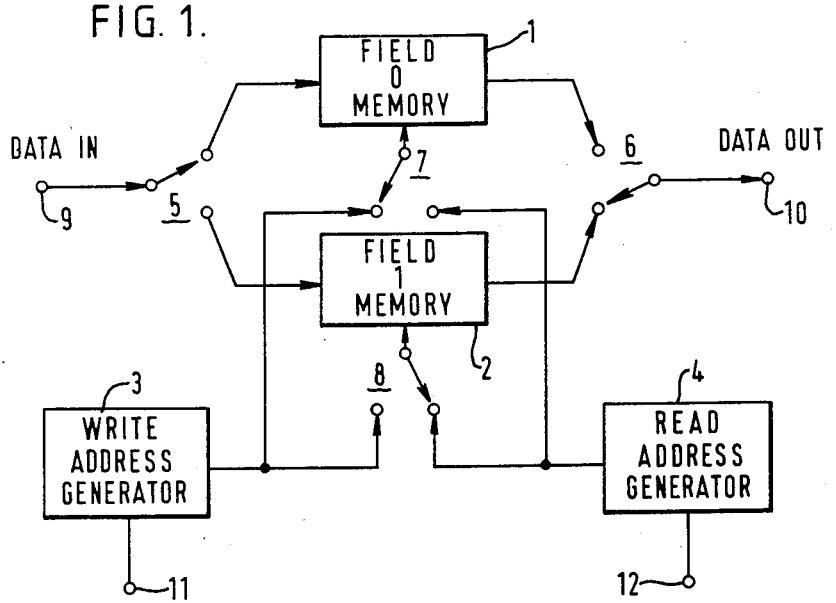
FIG. 1 shows in simplified block form a special effects equipment for a high definition video system.

Before describing the embodiment, the overall arrangement of an example of a special effects equipment for the high definition video system outlined above will be briefly described with reference to FIG. 1. Basically, the special effects equipment comprises two field memories, a field zero memory 1 and a field one memory 2, together with a write address generator 3 and a read address generator 4. These elements are interconnected by switches 5, 6, 7 and 8, each of which is operated at the field frequency. Input data supplied to an input terminal 9 are selectively supplied by way of the switch 5 to the field zero memory 1 or the field one memory 2. Output data for supply to an output terminal 10 are selectively derived by the switch 6 from the field zero memory 1 or the field one memory 2. The write address generator 3 and the read address generator 4 area selectively and alternately connected to the field zero memory 1 and the field one memory 2 by the switches 7 and 8.

In operation of this special effects equipment, an input analog signal is sampled 2048 times per horizontal scan line and the resulting sample values are pulse code modulation coded into 8-bit words to form the input digital data which are supplied to the input terminal 9. Writing proceeds alternately in the field zero memory 1 and the field one memory 2 in dependence on the position of the switch 5 and under the control of the write address generator 3. The necessary complex address calculations which are required so as not only to achieve simple writing and reading of the individual digital signals into and out of the appropriate memory 1 or 2, but also to modify the positions of the individual digital signals in the cathode ray tube screen raster so as to achieve the required special effect may be achieved under control of a signal supplied to the write address generator 3 by way of an input terminal 11 or under control of a signal supplied to the read address generator 4 by way of an input terminal 12. The way in which this is done is not of significance to the present invention and will not therefore be described in further detail here. When a complete field has been written in the memory 1 or 2, the switches 5 to 8 change position and the digital signals stored in that memory 1 or 2 are then sequentially read out under control of the read address generator 4 and supplied to the output terminal 10, while the digitial signals for the next field are written in the other memory 2 or 1.

The present invention is particularly concerned with the form and operation of the memories 1 and 2, which are such as to enable them to operate at the very high speed mentioned above.

Figure 2:
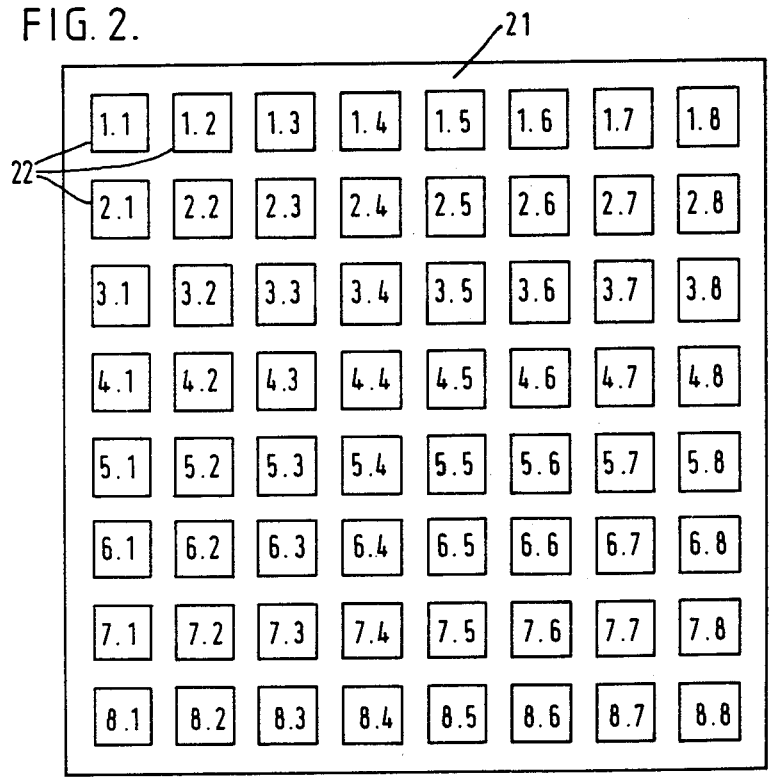
FIG. 2 shows diagrammatically the arrangement of an embodiment of video signal memory according to the present invention and used in the equipment of FIG. 1.

Referring to FIG. 2, each of the memories 1 and 2 of FIG. 1 comprises an array 21 of $n \times n$, where n is at least two and in this particular example n is equal to eight, memory modules 22. Each memory module 22 is addressed by its row and column number in the memory array 21 as indicated in FIG. 2, although it will be understood that the actual physical positions of the memory modules 22 on a circuit board need not correspond to the indicated positions in the memory array 21. Each memory module 22 comprises a random access memory (RAM) and an associated latch circuit. Each of the RAMs can store m 8-bit words, where in this particular example m is equal to 16K, so the memory array 21 as a whole can store $n^2m$ words, which is sufficient for one field of the video signal.

Another way of considering the memory array 21 is to say that it has eight rows and eight columns, and in the depth direction has 16K levels. Thus to write a word into the memory array 21 or to read it therfrom, the necessary address comprises level, row and column information.

Referring now to FIG. 3, this relates the memory array 21 of FIG. 2 to the screen 31 of a cathode ray tube. Each square in FIG. 3 corresponds to one level of the memory array 21, and the numbers within each square correspond to the row and column numbers of the respective memory module 22 of FIG. 2. Thus considering the screen 31 in FIG. 3, the first eight sample values in the first eight scan lines are stored in the top level or level zero of the memory array 21 of FIG. 2, the next eight sample values in the first eight scan lines are stored in the level one of the memory array 21, and so on for the whole area of the screen 31.

In use of the memory array 21, up to eight 8-bit words corresponding to the respective sample values at up to eight adjacent collinear sample positions of the raster on the screen 31 are written simultaneously. The effect of this is that no one of the memory modules 22 has more than one word written into it in each write cycle, even if the adjacent collinear sample positions overlap one or even two boundaries of the squares in FIG. 3. This will be further described below with reference to FIGS. 4 and 5, but first the reason why up to eight sample values are written in each write cycle, rather than always eight, will be briefly explained. In fact, from the original digital data, the number of sample values selected for writing is always eight, but this number may decrease due to the special effects processing. To take a simple example, if the special effects processing involves having the linear dimensions of an image, any eight adjacent collinear sample values initially selected will be reduced to four by the special effects processing.

Referring now to FIGS. 4 and 5, each of these shows the top left-hand square of FIG. 3 and parts of the three immediately adjacent squares. These squares, corresponding to levels in the memory modules 22, have level addresses which start at zero and progress sequentially along the top of the screen 31, continue in the next row of squares and so on. It is assumed that the level address of the first square in the second row of squares is N.

Consider now the example of FIG. 4. This shows the writing of eight adjacent collinear sample values disposed at zero degrees to the horizontal of the screen 31. To write these eight sample values, eight memory modules 22 in the memory array 21 are simultaneously addressed and are supplied with the respective 8-bit words representing the sample values to be stored therein. The eight addresses are 0, 2, 3; 0, 2, 4; 0, 2, 5; 0, 2, 6; 0, 2, 7; 0, 2, 8; 1, 2, 1 and 1, 2, 2, where the first number designates the level in the respective memory module 22, the second number designates the row in the memory array 21 and the third number designates the column in the memory array 21.

Consider now the example of FIG. 5. This shows the writing of eight adjacent collinear sample values disposed at 45 degrees to be horizontal of the screen 31. To write these eight sample values, eight memory modules 22 in the memory array 21 are simultaneously addressed and are supplied with the respective 8-bit words representing the sample values to be stored therein. The eight addresses are: 0, 3, 2; 0, 4, 3; 0, 5, 4; 0, 6, 5; 0, 7, 6; 0, 8, 7; N, 1, 8 and N+1, 2, 1, using the same notation as above.

From these examples it will be seen that by configuring the video memories and by having the write address generator (and calculator) 3 of FIG. 1 present the addresses in this way, then even if the eight adjacent collinear sample values cross one or two boundaries between the squares on the screen 31 of FIG. 3, it is never necessary to write two words into the same memory module 22 in the same write cycle.

The sample values referred to above are assumed to be the luminance sample values, and further, similar video signal memories operating the same way can be provided for the chrominance sample values.

The invention can be applied to video signal memories for use in other forms of television equipment and to frame memories. Also, the numbers n and m may be changed in consideration of the writing speed required and the amount of video digital data to be stored. Nor need the display be a cathode ray tube screen, as the invention can be used with other forms of raster display.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A video signal memory for storing $n^2m$ video data words, comprising:

$n^2$ memory modules each capable of storing m said video data words corresponding respectively to sample values at respective sample positions of a raster display, each said memory module being arranged to store one only of said video data words in any square of n by n said sample positions of said raster in any one write cycle; and means to write up to n said video data words corresponding to n adjacent sample positions of said raster in said video memory in any one write cycle, said sample positions forming a line that may extend in any of a plurality of directions including a diagonal direction.

2. A video signal memory according to claim 1 wherein each said memory module is a random access memory.

3. A video signal memory according to claim 1 wherein n is equal to eight.

4. A video signal memory according to claim 1 for use in a high definition video system and wherein m is equal to 16K.

5. A video signal memory according to claim 1 forming part of a special effects equipment in a high definition video system.

* * * * *